(12) United States Patent
Liu

(10) Patent No.: US 6,894,898 B2
(45) Date of Patent: May 17, 2005

(54) FIXING APPARATUS FOR HEAT SINK

(75) Inventor: HeBen Liu, Shenzhen (CN)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/441,694

(22) Filed: May 19, 2003

(65) Prior Publication Data

US 2004/0052055 A1 Mar. 18, 2004

(30) Foreign Application Priority Data

Sep. 17, 2002 (TW) .................................... 91214615 U

(51) Int. Cl.[7] ............................................... H05K 7/20
(52) U.S. Cl. ...................... 361/697; 361/695; 361/710; 248/510; 24/458; 257/706
(58) Field of Search ............................... 257/705–707, 257/713, 717–719; 248/510; 24/297, 458, 453, 457, 625; 361/717–719, 709, 710, 695, 697

(56) References Cited

U.S. PATENT DOCUMENTS

| | | | | |
|---|---|---|---|---|
| 5,241,453 A | * | 8/1993 | Bright et al. | 361/704 |
| 5,276,585 A | * | 1/1994 | Smithers | 361/704 |
| 5,617,292 A | * | 4/1997 | Steiner | 361/706 |
| 5,761,036 A | * | 6/1998 | Hopfer et al. | 361/704 |
| 6,430,049 B1 | * | 8/2002 | Lai et al. | 361/704 |
| 6,449,157 B1 | * | 9/2002 | Chu | 361/704 |
| 6,466,443 B1 | * | 10/2002 | Chen | 361/695 |
| 6,466,445 B1 | * | 10/2002 | Chen | 361/704 |
| 6,525,941 B1 | * | 2/2003 | Lai | 361/697 |
| 6,570,763 B1 | * | 5/2003 | McHugh et al. | 361/704 |
| 6,646,880 B1 | * | 11/2003 | Liu | 361/719 |
| 6,678,160 B1 | * | 1/2004 | Liu | 361/719 |
| 6,728,107 B2 | * | 4/2004 | Tseng et al. | 361/719 |

\* cited by examiner

*Primary Examiner*—Anatoly Vortman
(74) *Attorney, Agent, or Firm*—Wei Te Chung

(57) ABSTRACT

A fixing apparatus (30) for pressing a heat sink (70) against an electronic device (20) positioned in a retention module (62), includes two pressing members (32) and a fastener (52). An elongate slot (34) is defined in a center of each pressing member. Two spring fingers (36) extend inwardly and downwardly from the pressing member at opposite ends of the slot respectively. An engaging portion (42) is formed at an end of the pressing member. A locking leg (47) depends from an opposite end of the pressing member. Two engaging slots (54) are defined in opposite ends of the fastener for receiving the engaging portion of the pressing member. Two locking legs (56) depend from opposite ends of the fastener respectively. A hook (48, 57) is defined at a distal end of each locking leg.

13 Claims, 3 Drawing Sheets

FIXING APPARATUS FOR HEAT SINK

BACKGROUND OF THE INVENTION

1. Field of the Invention

The present invention relates to fixing apparatuses for heat sinks, and particularly to a fixing apparatus which provides uniform pressure distribution.

2. Related Art

With the rapid development of computers, the processing speeds of the processing units of computers have become faster and faster. As a result, a modern processing unit consumes considerable electronic energy and generates much heat. To prevent a processing unit from overheating, it is conventional to install a heat sink pressing against the processing unit. Typically, a fixing apparatus is needed to firmly press the heat sink against the processing unit.

A conventional fixing apparatus as disclosed in U.S. Pat. No. 5,671,118 is used to press a heat sink against a processing unit. Referring to FIG. 3, a channel 12 is defined in a central portion of the heat sink 10. The fixing apparatus 14 is received in the channel 12. Two engaging portions 24 are provided on opposite ends of a socket 22. The fixing apparatus 14 can engage with the engaging portions 24, and thereby firmly press the heat sink 10 against the processing unit 20.

However, the fixing apparatus 14 only presses on a middle portion of the heat sink 10. As a result, the pressure distribution is not uniform, and the heat dissipating efficiency of the heat sink 10 is diminished. This is particularly in the case when the heat sink 10 is large. In addition, a fan can not be attached onto the fixing apparatus 14 to provide forced ventilation for the heat sink 10.

SUMMARY OF THE INVENTION

Accordingly, an object of the present invention is to provide a fixing apparatus which provides uniform pressure distribution on a heat sink.

To achieve the above-mentioned object, a fixing apparatus in accordance with a preferred embodiment of the present invention is for pressing a heat sink against an electronic device positioned in a retention module, includes two pressing members and a fastener. An elongate slot is defined in a center of each pressing member. Two spring fingers extend inwardly and downwardly from the pressing member at opposite ends of the slot respectively. An engaging portion is formed at an end of the pressing member. A locking leg depends from an opposite end of the pressing member. Two engaging slots are defined in opposite ends of the fastener for receiving the engaging portion of the pressing member. Two locking legs depend from opposite ends of the fastener respectively. A hook is defined at a distal end of each locking leg.

Other objects, advantages and novel features of the present invention will be drawn from the following detailed description of the preferred embodiment of the present invention with attached drawings, in which:

DESCRIPTION OF THE PREFERRED EMBODIMENT

Figure 1:
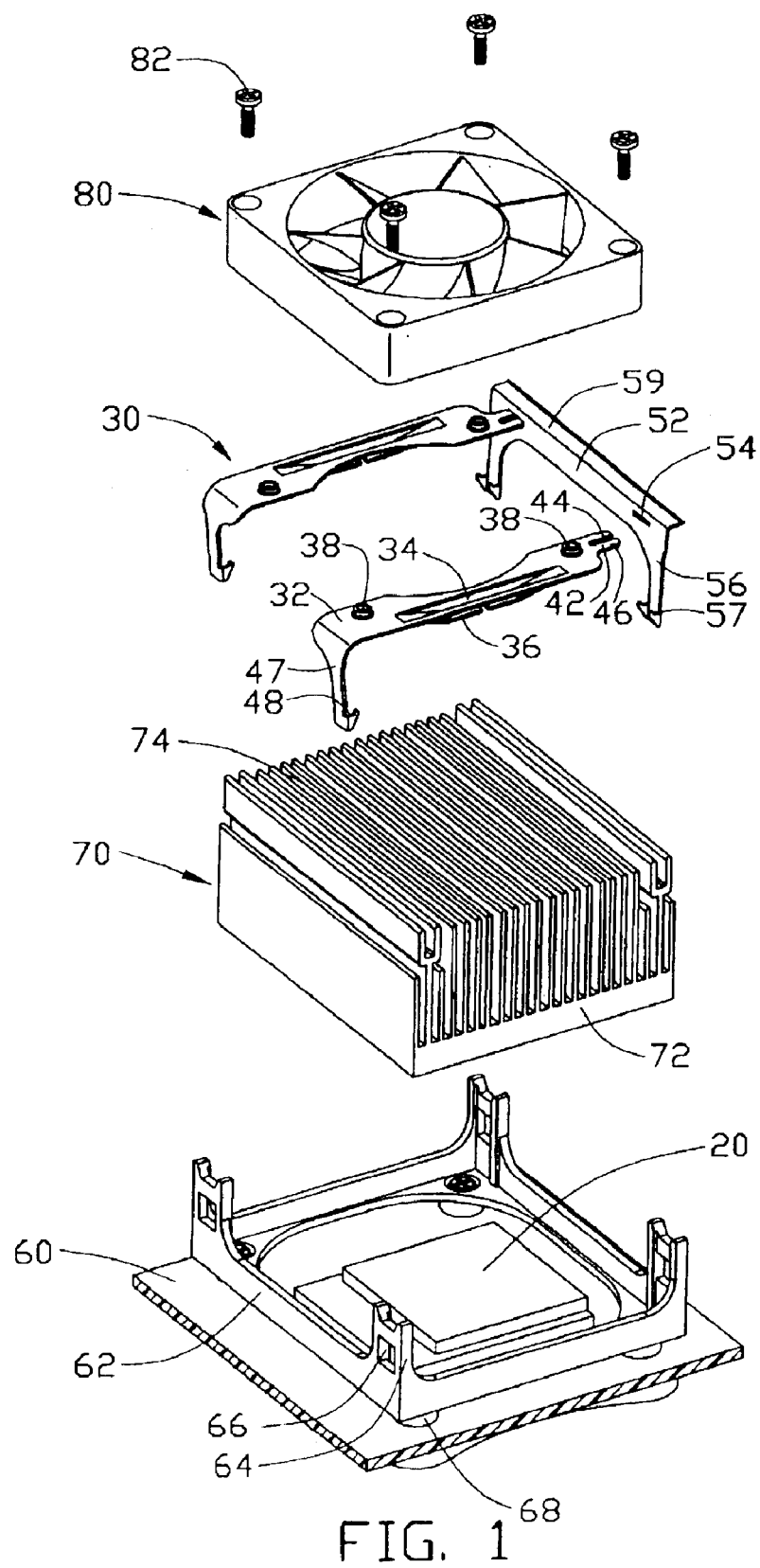
FIG. 1 is an exploded, isometric view of a fixing apparatus in accordance with the preferred embodiment of the present invention, together with a fan, a heat sink, a retention module, a processing unit, and a circuit board.
Figure 2:
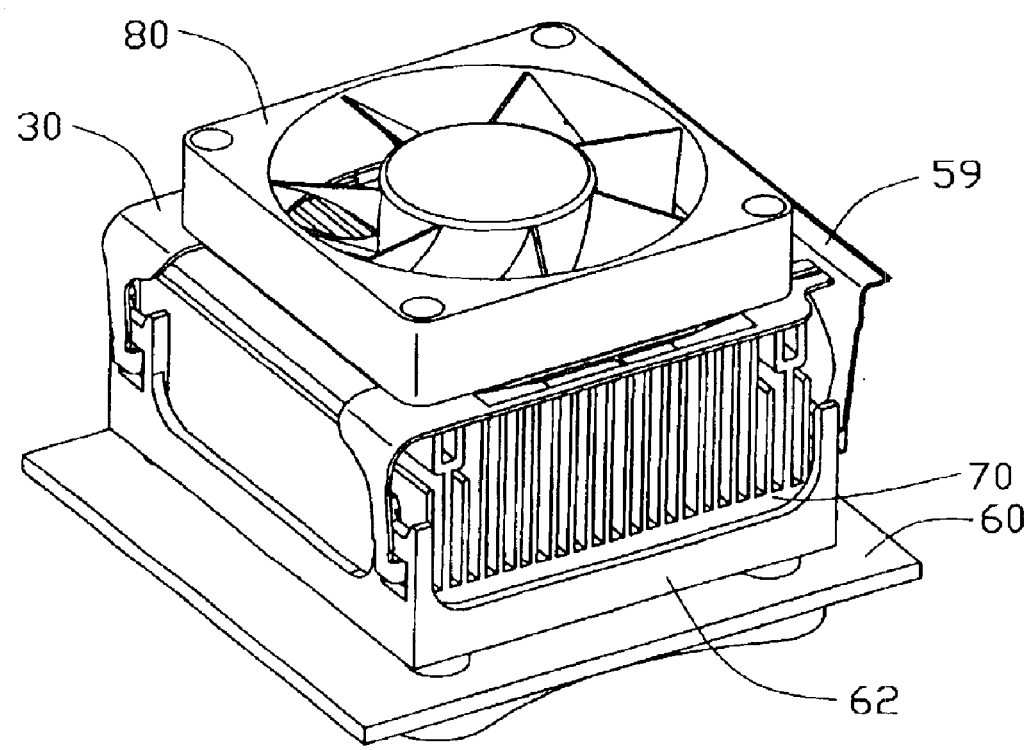
FIG. 2 is an assembled view of FIG. 1.
Figure 3:
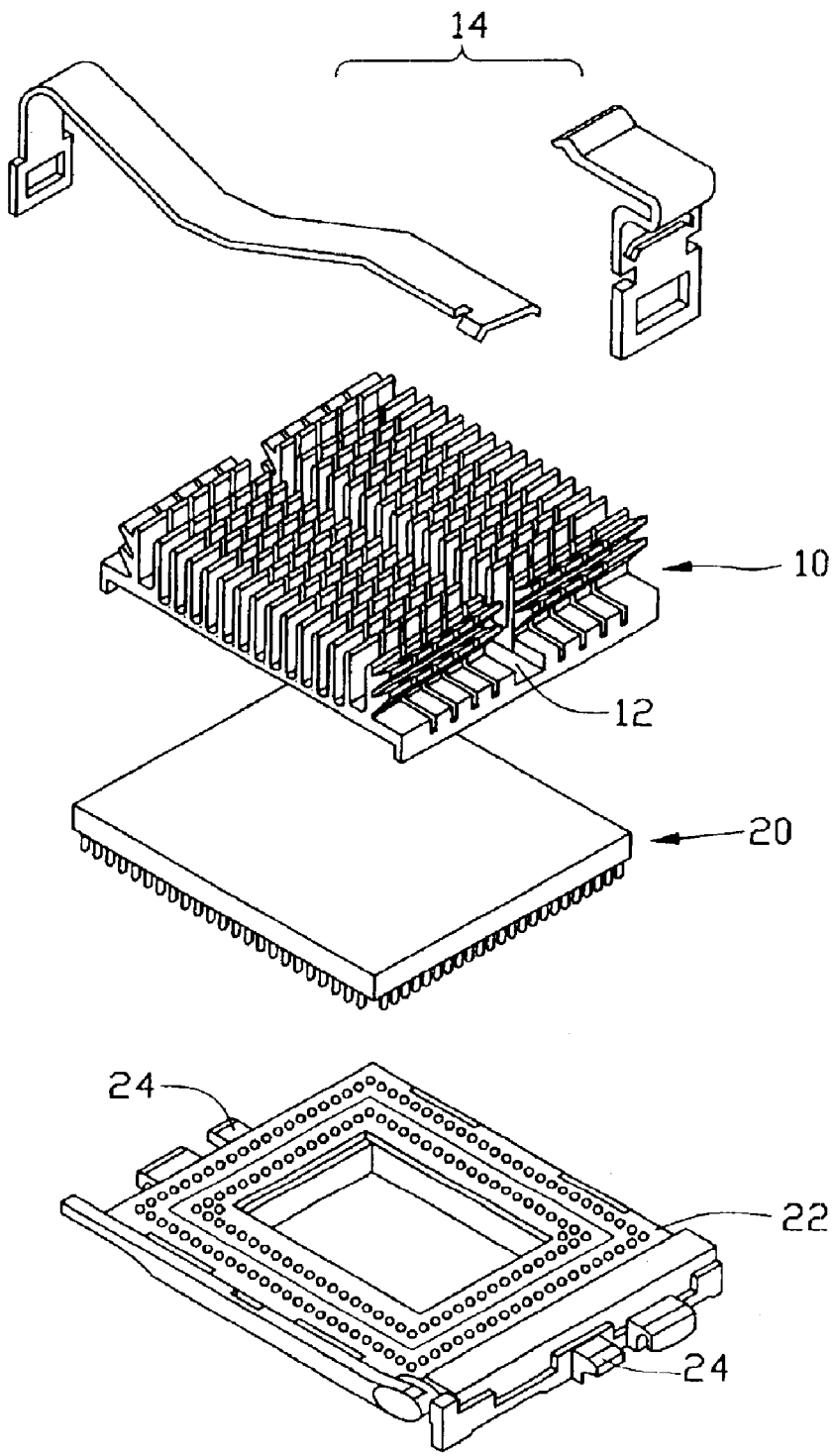
FIG. 3 is an exploded, isometric view of a conventional fixing apparatus, together with a heat sink, a processing unit and a socket.

Referring to FIGS. 1–2, the present invention will be described in its preferred embodiment in conjunction with a rotary fan 80, a heat sink 70, a retention module 62, a processing unit 20, and a circuit board 60. A fixing apparatus 30 in accordance with the preferred embodiment of the present invention is engaged with the retention module 62, for pressing the heat sink 70 against the processing unit 20. Additionally, the fan 80 can be attached onto the fixing apparatus 30 for increasing an efficiency of heat removal.

The processing unit 20 is located in a center of the retention module 62. Four locking columns 64 extend upwardly from four corners of the retention module 62 respectively. A locking hole 66 is defined in each locking column 64. Four fixing columns 68 depend from four corners of the retention module 62 respectively, for fixing the retention module 62 to the circuit board 60. The heat sink 70 comprises a base 72, and a plurality of parallel fins 74 extend upwardly from the base 72.

The fixing apparatus 30 comprises two elongate pressing members 32 and an elongate fastener 52. An elongate slot 34 is defined in a center of each pressing member 32. Two spring fingers 36 extend respectively inwardly and downwardly from the pressing member 32 at opposite ends of the slot 34, for resiliently pressing the heat sink 70. Two fixing holes 38 are defined in the pressing member 32 near the opposite ends of the slot 34 respectively. An engaging portion 42 is formed at an end of the pressing member 32. An opening 44 is longitudinally defined in a center of the engaging portion 42, for providing resiliency for the engaging portion 42. Two locking grooves 46 are defined in opposite lateral edges of the engaging portion 42 respectively. A locking leg 47 depends from an opposite end of the pressing member 32. A hook 48 is formed at a distal end of the locking leg 47, for engaging in a corresponding locking hole 66 of the retention module 62. The pressing member 32 has a concave inner edge near the slot 34, the edge corresponding to a passage of airflow from the fan 80.

The fastener 52 defines two spaced, aligned engaging slots 54 in opposite ends thereof respectively, for engagingly receiving the engaging portions 42 of the pressing members 32 respectively. Two locking legs 56 depend from opposite ends of the fastener 52 respectively. A hook 57 is formed at a distal end of each locking leg 56, for engaging in a corresponding locking hole 66 of the retention module 62. An operating portion 59 is bent outwardly from a top edge portion of the fastener 52.

In assembly of the fixing apparatus 30, the engaging portions 42 of the pressing members 32 are inserted into the engaging slots 54 of the fastener 52. The engaging portions 42 are resiliently compressed as they pass through the engaging slots 54, and then resiliently snap back to their original shapes. In this position, the engaging portions 42 are firmly engaged in the engaging slots 54. Opposite edge portions of the fastener 52 at each engaging slot 54 are engaged in the locking grooves 46 of the corresponding engaging portion 42.

In assembly of the fixing apparatus 30 to the heat sink 70, the fixing apparatus 30 is placed onto the heat sink 70. The hooks 48 of the pressing members 32 are engaged in the corresponding locking holes 66 of the retention module 62.

The operating portion 59 is depressed, so that the hooks 57 of the fastener 52 engage in the corresponding locking holes 66 of the retention module 62. The spring fingers 36 of the fixing apparatus 30 resiliently depress opposite sides of the heat sink 70 respectively, thereby applying uniform pressure on the heat sink 70. Four screws 82 are extended through the fan 80 and engaged in the fixing holes 38 of the pressing members 32, thereby fixing the fan 80 onto the fixing apparatus 30.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A fixing apparatus for pressing a heat sink against a processing unit, the fixing apparatus comprising:

two pressing members, each of the pressing members forming at least one spring finger extending therefrom for pressing the heat sink against the processing unit, a looking leg depending from an end of each of the pressing members; and a fastener detachably connected with respective opposite ends of the pressing members, the fastener having two locking legs depending from opposite ends thereof repectively; wherein each of the pressing members has a concave inner edge.

2. The fixing apparatus as described in claim 1, wherein two fixing holes are defined in each of the pressing members near the opposite ends thereof respectively for securing a fan thereon.

3. The fixing apparatus as described in claim 1, wherein each of the pressing members comprises an engaging portion formed at the opposite end thereof; and the fastener defines two spaced engaging slots engagingly receiving the engaging portions respectively.

4. The fixing apparatus as described in claim 3, wherein an opening is longitudinally defined in the engaging portion for providing resiliency for the engaging portion.

5. The fixing apparatus as described in claim 4, wherein two locking grooves are defined in opposite lateral edges of the engaging portion respectively, for engagingly receiving the fastener at a corresponding engaging slot.

6. The fixing apparatus as described in claim 1, wherein each of the pressing members defines a slot therein, and forms two spring fingers, which extend respectively inwardly and downwardly from the pressing member at opposite ends of the slot.

7. The fixing apparatus as described in claim 1, wherein a hook is formed on each of the locking legs.

8. A fixing apparatus for use with a heat sink assembly, said heat sink assembly including a heat sink, an electronic package and a retention module, said fixing apparatus comprising:

a pair of elongated members for laterally extending across said heat sink assembly, and a fastener connected with the two elongated members on a first side of said fixing apparatus, a pair of first legs extending downwardly from respective ends of the elongated members on a second side of the fixing apparatus, a pair of second legs extending downwardly from respective ends the fastener on said second side, both said first and said second legs being adapted to be locked to the retention module;

said elongated members including at least one downwardly extending spring fingers for downwardly biasing the heat sink against the electronic package; wherein said elongated members define at least one fixing device for fixing a fan thereto and each of said elongated members has a concave inner edge.

9. The fixing apparatus as claimed in claim 8, wherein said pair of elongated members provides an upward flat horizontal surface around the fixing device for allowing the fan to be seated thereupon.

10. The fixing apparatus as claimed in claim 8, wherein said fixing device is a screw hole.

11. A fixing apparatus comprising:

an elongated member having one leg downwardly extending from one end thereof;

a fastener pivotally linked to the other end of the said elongated member;

a spring portion downwardly bulged around a middle portion of the combined elongated member and fastener; and a pair of fixing devices formed on the elongated member adjacent two sides of said spring portion for fastening a fan thereto; wherein the elongated member provides an upward flat horizontal surface spanning between said fixing devices for allowing the fan to be seated thereupon.

12. The fixing apparatus as claimed in claim 11, wherein the elongated members has a concave inner edge.

13. The fixing apparatus as claimed in claim 11, wherein the elongated member defines a slot at said horizontal surface, inner edges of the elongated member at the slot space a distance with outer edges of said horizontal surface, and the spring portion comprises a spring finger extending inwardly and downwardly from one of said inner edges of the elongated member.

\* \* \* \* \*